(12) United States Patent
Abe

(10) Patent No.: US 7,215,176 B2
(45) Date of Patent: May 8, 2007

(54) ANALOG VALUE ADJUSTMENT CIRCUIT, DISPLAY DRIVER CIRCUIT, AND METHOD OF ADJUSTING ANALOG VALUE

(75) Inventor: Masaaki Abe, Chin (JP)

(73) Assignee: Seiko Epson Corporation, Tokyo (JP)

( * ) Notice: Subject to any disclaimer, the term of this patent is extended or adjusted under 35 U.S.C. 154(b) by 114 days.

(21) Appl. No.: 10/952,574

(22) Filed: Sep. 28, 2004

(65) Prior Publication Data
US 2005/0104617 A1     May 19, 2005

(30) Foreign Application Priority Data
Sep. 29, 2003  (JP)  .............................. 2003-336923

(51) Int. Cl.
*H01H 37/76*  (2006.01)
(52) U.S. Cl. ...................... 327/525; 327/526
(58) Field of Classification Search ................... None
See application file for complete search history.

(56) References Cited

U.S. PATENT DOCUMENTS

| | | | | |
|---|---|---|---|---|
| 5,384,746 A | * | 1/1995 | Giolma .................... | 365/225.7 |
| 5,677,917 A | * | 10/1997 | Wheelus et al. ............ | 714/726 |
| 5,723,999 A | * | 3/1998 | Merritt ...................... | 327/526 |
| 5,867,055 A | * | 2/1999 | Asaumi et al. ............. | 327/525 |
| 6,359,428 B1 | * | 3/2002 | Kawamura ................. | 323/369 |
| 6,757,204 B2 | * | 6/2004 | Di Ronza et al. ........... | 365/200 |
| 6,888,397 B2 | * | 5/2005 | Tsuchiya .................... | 327/512 |
| 2004/0108882 A1 | | 6/2004 | Masaaki .................... | 327/525 |

FOREIGN PATENT DOCUMENTS

| | | |
|---|---|---|
| JP | 62-069240 | 3/1987 |
| JP | 03-172906 | 7/1991 |
| JP | 04-092296 | 3/1992 |
| JP | 04-230878 | 8/1992 |
| JP | 05-346826 | 12/1993 |
| JP | 10-074839 | 3/1998 |
| JP | 10-289577 | 10/1998 |
| JP | 2001-273041 | 10/2001 |
| JP | 2002-026258 | 1/2002 |
| JP | 2003-086700 | 3/2003 |
| JP | 2003-152092 | 5/2003 |

* cited by examiner

*Primary Examiner*—My-Trang Nuton
*Assistant Examiner*—Cassandra Cox
(74) *Attorney, Agent, or Firm*—Hogan & Hartson LLP

(57) ABSTRACT

An analog value adjustment circuit includes a fuse circuit that outputs fuse data whose value changes corresponding to whether first through Nth (N is an integer of two or more) fuse elements are in a cutting state, or in a non-cutting state and an analog value output circuit that receives the fuse data from the fuse circuit, and outputs an analog value that is adjusted in a given adjustment range corresponding to the fuse data. When the fuse data from the fuse circuit is data indicating that all the first through Nth fuse elements are in the non-cutting state, the analog value output circuit outputs the analog value with a typical value that is a value between a maximum value and a minimum value in the given adjustment range.

9 Claims, 11 Drawing Sheets

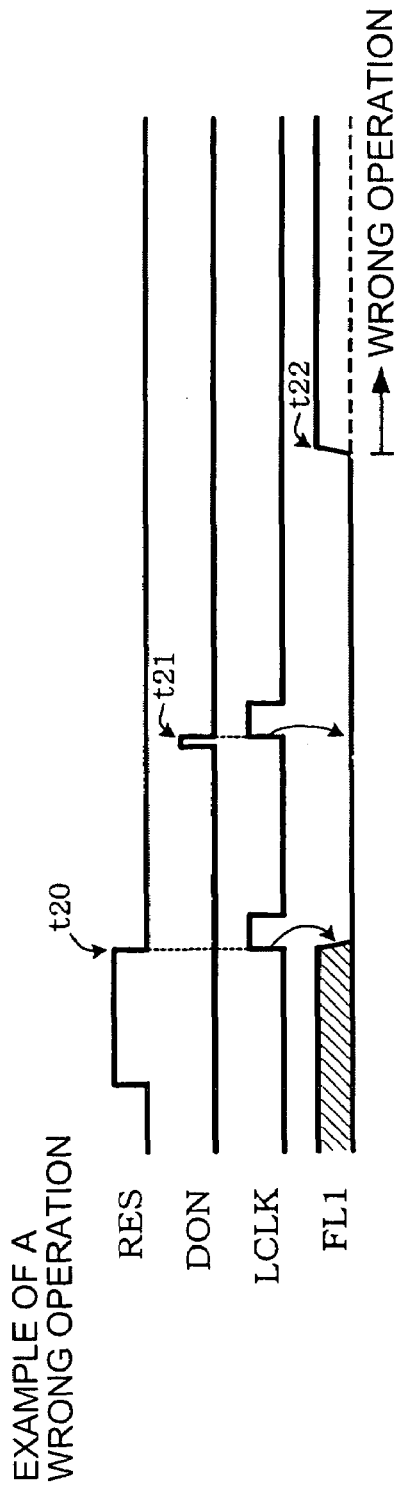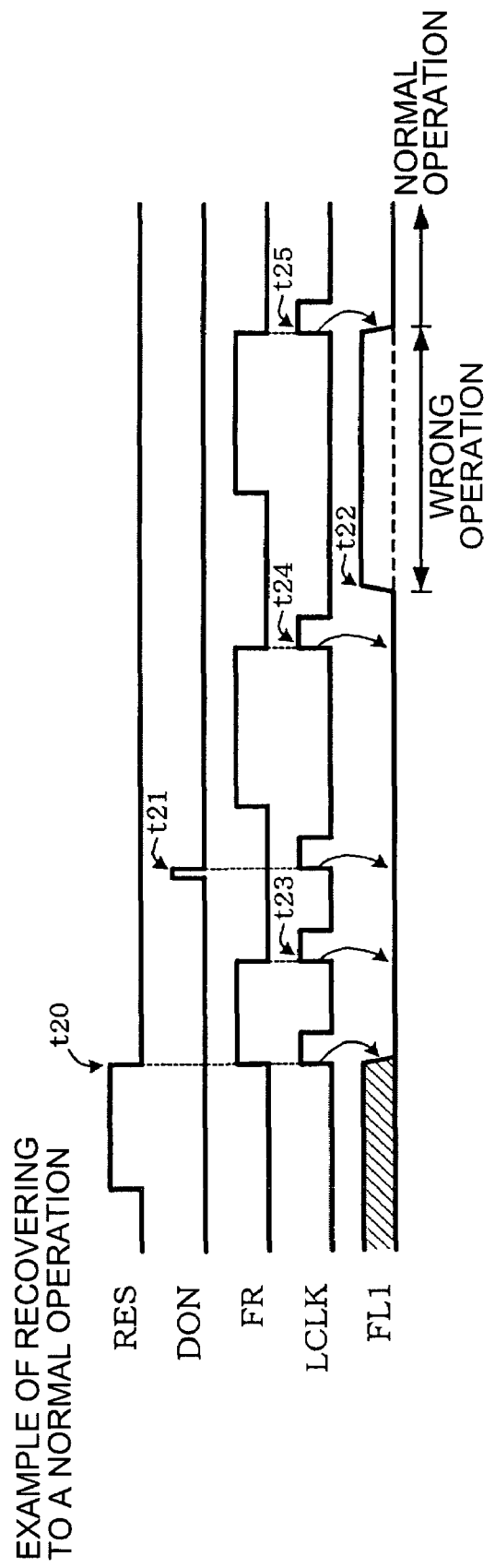
FIG. 9A — EXAMPLE OF A WRONG OPERATION
FIG. 9B — EXAMPLE OF RECOVERING TO A NORMAL OPERATION

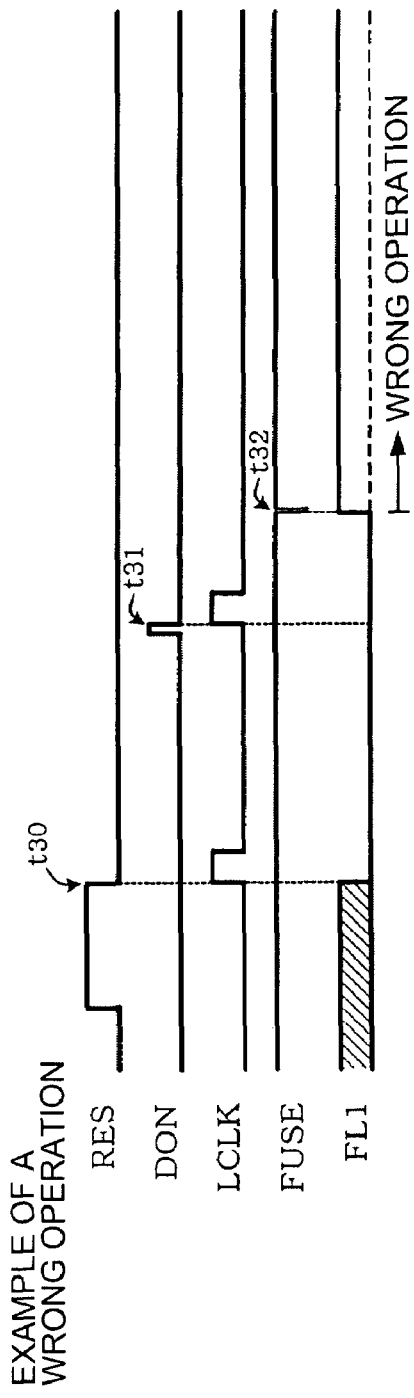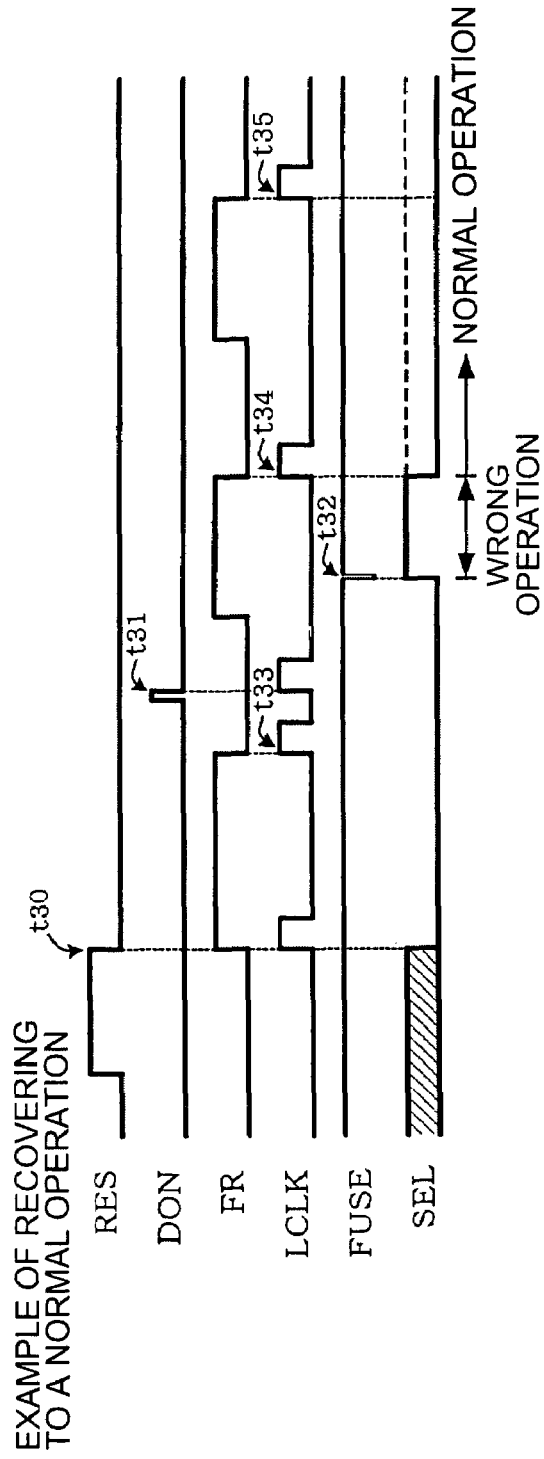

ANALOG VALUE ADJUSTMENT CIRCUIT, DISPLAY DRIVER CIRCUIT, AND METHOD OF ADJUSTING ANALOG VALUE

BACKGROUND OF THE INVENTION

1. Field of the Invention

The present invention relates to an analog value adjustment circuit, a display driver circuit, and a method of adjusting an analog value.

2. Description of the Related Art

In order to absorb the process-parameter variation due to a manufacturing variation in semiconductor integrated circuits, a fuse circuit is sometimes used. Using the fuse circuit, analog values, such as a desired voltage value, current value, and oscillation frequency in a circuit, can be adjusted corresponding to the states set up by fuse elements that can be cut (blown out). For example, in the case of a display driver circuit which drives a display panel, such as a liquid crystal panel, a liquid crystal driving voltage with high precision is needed in order to carry out extremely fine picture expressions. However, it is difficult to generate an optimal liquid crystal driving voltage because of manufacturing variations or the like of the liquid crystal materials and the display driver circuit of the liquid crystal panel. Then, by generating a condition corresponding to a setup state (cutting state or non-cutting state) of the fuse elements using the fuse circuit and by carrying out fine-adjustments of the liquid crystal driving voltage corresponding to this state, an optimal picture expression can be realized.

However, a cutting (trimming) process of the fuse elements in an inspection process of semiconductor integrated circuits needs to be carried out on all semiconductor integrated circuits (semiconductor chips) on a wafer. For this reason, the cutting process of the fuse elements ends up taking a long time, thereby causing a problem of inviting an increase in the cost of the chip or the like.

SUMMARY OF THE INVENTION

The present invention has been made in view of the above problem, and is intended to provide an analog value adjustment circuit which can realize time reduction or the like in the cutting process of fuse elements, a display driver circuit including this circuit, and a method of adjusting an analog value using the same.

The present invention relates to an analog value adjustment circuit that adjusts an analog value using fuse elements. The analog value adjustment circuit includes a fuse circuit that outputs fuse data whose value changes corresponding to whether first through Nth (N is an integer of two or more) fuse elements are in a cutting state, or in a non-cutting state. The analog value adjustment circuit also includes an analog value output circuit that receives the fuse data from the fuse circuit and outputs the analog value that is adjusted in a given adjustment range corresponding to the fuse data. In the case where the fuse data from the fuse circuit is the data indicating that the first through Nth fuse elements are all in the non-cutting state, the analog value output circuit outputs the analog value with a typical value that is a value between a maximum value and a minimum value in the adjustment range.

According to the present invention, the fuse data value changes corresponding to the setup state (cutting state, non-cutting state) of the first through Nth fuse elements, and the analog value that is adjusted corresponding to the fuse data is outputted. Then, according to the present invention, in the case where all of the first through Nth fuse elements are in the non-cutting state, the analog value with the typical value is made to be outputted. Then, for the other cases, other values (a maximum value, a minimum value, a value next to the typical value, or the like) in the adjustment range will be outputted. Therefore, according to the present invention, in a lot of analog value adjustment circuits (semiconductor integrated circuits) at the time of mass production or the like, the first through Nth fuse elements will end up not being cut, and thus, the time reduction or the like in the cutting process of fuse elements can be attained.

Moreover, according to the present invention, the analog value output circuit may be made to output the analog value that is adjusted so that the adjustment width thereof becomes wider thus, being closer to the maximum value or the minimum value in the adjustment range, and the adjustment width thereof becomes narrower thus, being closer to the typical value. In this manner, in the vicinity of the typical value, high precision adjustment with a narrow adjustment width can be carried out, and the accuracy of the outputted analog value can be increased.

Moreover, according to the present invention, the analog value output circuit includes a ladder resistor circuit including a plurality of resistor elements that are series-coupled between a first and a second node and a select circuit that selects any taps of the first through Kth taps of the ladder resistor circuit (K is an integer of two or more) corresponding to the fuse data from the fuse circuit and adjusts the analog value. The select circuit may be made to select a Lth tap (L is an integer and 1<L<K) corresponding to the typical value, in the case where the fuse data from the fuse circuit is the data indicating that all the first through Nth fuse elements are in the non-cutting state. In this manner, when the fuse data is the data indicating that all of the first through Nth fuse elements are in the non-cutting state, the Lth tap corresponding to the typical value is selected among the first through the Kth taps of the ladder resistor circuit, and the analog value with the typical value is made to be outputted.

Moreover, according to the present invention, in the ladder resistor circuit, the first through Kth taps may be set so that the resistance of the resistor elements between taps becomes larger as being drawn closer to the first or Kth tap, and the resistance of the resistor elements between taps becomes lower as being drawn closer to the Lth tap corresponding to the typical value. If doing this way, in the vicinity of the typical value, high precision adjustment with a narrow adjustment width can be carried out, and the accuracy of the outputted analog value can be increased.

Moreover, according to the present invention, the select circuit may be made to select a tap next to the Lth tap corresponding to the typical value, in the case where the fuse data from the fuse circuit is the data indicating that only one of the first through Nth fuse elements is in the non-cutting state. In this manner, the probability that the cutting number of the fuse element is one or less becomes high, and the time reduction or the like in the cutting process of the fuse elements can be attained Moreover, according to the present invention, the select circuit may include wiring capable of changing the wiring coupling pattern by a mask change and that couples a select input node of the select circuit to the first through Kth taps of the ladder resistor circuit. In this manner, the Lth tap or the like that is selected when the fuse data is the data indicating that the first through Nth fuse elements are all in the non-cutting state, can be changed to an arbitrary tap by the mask change.

Moreover, according to the present invention, the fuse circuit includes a latch circuit that stores a setup state for the first through Nth fuse elements and a latch clock generation circuit that generates a latch clock for taking in the setup state for the first through Nth fuse elements to the latch circuit based on a periodic signal. The latch circuit periodically takes in the setup state for the first through Nth fuse elements based on the latch clock, and the fuse circuit may be made to output the fuse data corresponding to the setup state for the first through Nth fuse elements taken in to the latch circuit.

According to the present invention, the setup state of the fuse elements can be taken in periodically to the latch circuit by using the latch clock that is generated based on the periodic signal. Therefore, even if the stored contents of the latch circuit changes due to external noises or the like, such as static electricity or the like, the stored contents of the latch circuit can be updated periodically. As a result, the analog value will not be accidentally adjusted to cause a wrong operation based on the stored contents of the latch circuit, and it is possible to return to a normal operation based on the analog value that is adjusted to the value to which the value should originally be adjusted.

Moreover, according to the present invention, the fuse circuit includes a test signal storing circuit that stores a test signal of the first through Nth fuse elements, a selector which selects and outputs, based on a select signal, either one of the test signal stored in the test signal storing circuit, and the setup state for the first through Nth fuse elements taken in to the latch circuit and a select signal generation circuit which generates the select signal based on a test mode setup signal and the latch clock. The select signal generation circuit may be made to generate the select signal, so that the setup state for the first through Nth fuse elements, which are taken in to the latch circuit, is selected and outputted by the selector when the latch clock is inputted. In this manner, even if accidentally having shifted to the test mode because the test mode setup signal changes due to external noises or the like, such as static electricity or the like, the setup state of the fuse elements that is taken in to the latch circuit can be selected and outputted, with the selector. Therefore, even if having shifted to the test mode due to the above described causes, it is possible to return to the normal operation.

Moreover, the present invention relates to a display driver circuit including one of the above described analog value adjustment circuits, and the driver circuit which drives a display panel based on a voltage value or a current value, and the periodic signal that are adjusted by the analog value adjustment circuit.

Moreover, the present invention relates to a method of adjusting the analog value using any one of the above described analog value adjustment circuits, including determining the setup state for the first through Nth fuse elements at the time of outputting the analog value, which is nearest to a target value in a test mode using a test circuit, cutting each of the first through Nth fuse elements so that the first through Nth fuse elements becomes as in the determined setup state and monitoring the output of the analog value adjustment circuit in a normal operation mode using the first through Nth fuse elements after the cutting.

BRIEF DESCRIPTION OF THE SEVERAL VIEWS OF THE DRAWINGS

FIGS. 9(A) and (B) are explanatory diagrams of a method of preventing malfunction, with a periodic signal according to an embodiment of the present invention.

FIGS. 10(A) and (B) are also explanatory diagrams of a method of preventing malfunction, with a periodic signal according to an embodiment of the present invention.

DETAILED DESCRIPTION OF THE INVENTION

Hereinafter, suitable embodiments according to the present invention will be described in detail using accompanying drawings. In addition, the embodiments described below do not limit unfairly the content of the present invention described in the claims. Moreover, all of the structures to be described below are not necessarily indispensable structural requirements for the present invention.

1. Analog Value Adjustment Circuit

Figure 1:
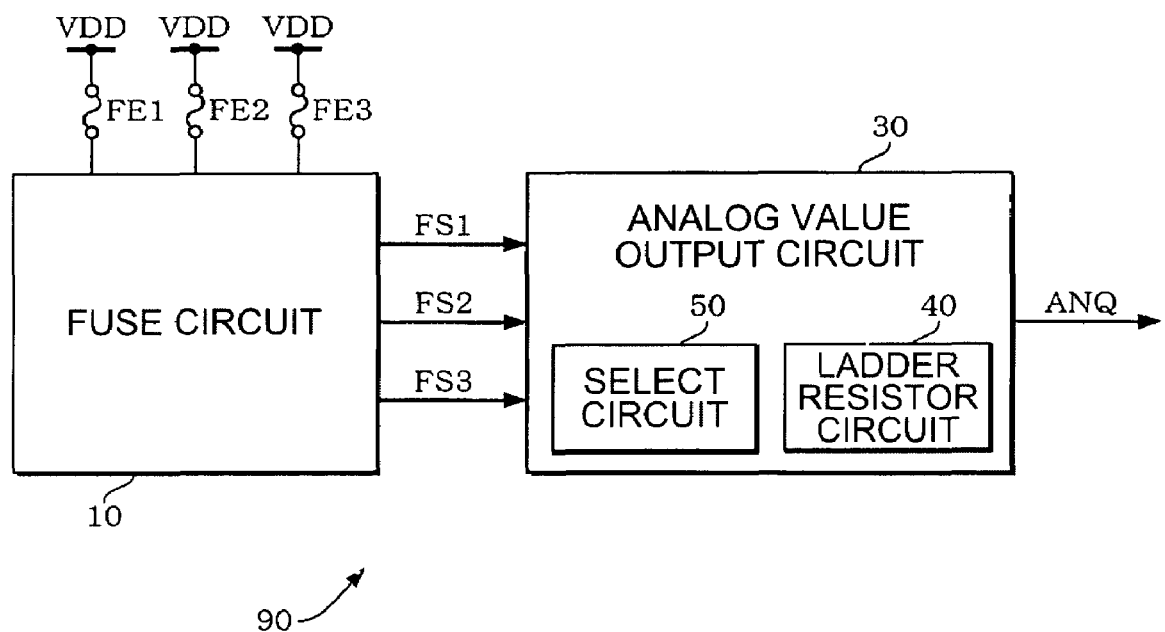
FIG. 1 is an example of a structure of an analog value adjustment circuit according to an embodiment of the present invention.

In FIG. 1, an example of a structure of an analog value adjustment circuit 90 according to an embodiment of the present invention is shown. This analog value adjustment circuit 90 is a circuit for adjusting the analog value, such as a voltage value, a current value, resistance value, a capacitance value, or an oscillation frequency, using fuse elements FE1, FE2, and FE3 (in a broad sense, first through Nth fuse elements), and includes a fuse circuit 10 and an analog value output circuit 30. In addition, hereinafter, a case using 3-bit fuse elements will be described as an example, however, the present embodiment is not limited to this, but also applicable to cases where the fuse elements of 2 bits, 4 bits or more, are used.

The fuse elements FE1 through FE3 are the elements that adjust the analog value corresponding to the setup state thereof (state whether each fuse element is in the cutting state or in the non-cutting state). Each of the fuse elements FE1 through FE3 can be cut (blown out, trimmed) by applying, for example, a given high voltage to both of its ends.

The fuse circuit 10 is a circuit that outputs each of the bits FS1 through FS3 (hereinafter, simply referred to as fuse data FS1 through FS3) of the fuse data whose value changes corresponding to the setup state (cutting state or non-cutting state) of the fuse elements FE1 through FE3. Specifically, in the case where each of the fuse elements FE1 through FE3 is in the non-cutting state, each (each bit) of the fuse data FS1 through FS3 is set to a first logic level "0." On the other hand, in the case where each of the fuse elements FE1 through FE3 is in the cutting state, each of the fuse data FS1 through FS3 is set to a second logic level "1."

In addition, in FIG. 1, the number of bit for the fuse elements FE1 through FE3 and the number of bit of the fuse data FS1 through FS3 are 3 bits. However, the present embodiment is not limited to the fuse elements FE1 through FE3 and fuse data FS1 through FS3 having the same number of bits.

Moreover, in the fuse circuit 10, the circuit that stores the setup state (for example, "1" at the time of the cutting state and "0" at the time of the non-cutting state) of the fuse elements FE1 through FE3 can be included. Furthermore, a test circuit constituted by a circuit that stores a test signal, and a selector for switching a test mode and a normal operation can be also included.

The analog value output circuit 30 is a circuit which receives the fuse data FS1 through FS3 from the fuse circuit 10 and outputs an analog value ANQ which is adjusted in a given adjustment range (adjustment range including a minimum value, the typical value, and a maximum value) based on the fuse data FS1 through FS3. Specifically, when the fuse data FS1 through FS3 changes from (000) to (111), the analog value ANQ can be also changed in the adjustment range, accordingly. By making such a structure, the analog value ANQ corresponding to the setup state (cutting/non-cutting state) of the fuse elements FE1 through FE3 can be outputted.

Then, according to the present embodiment, the analog value output circuit 30 outputs the analog value (analog value in a typical condition) with the typical value, in the case where the fuse data FS1 through FS3 from the fuse circuit 10 is the data indicating that all the fuse elements FE1 through FE3 are in the non-cutting state. More specifically, in the case where all of the fuse elements FE1 through FE3 are in the non-cutting state and the fuse data FS1 through FS3 is (000), the analog value with the typical value between the maximum value and the minimum values is outputted. Then, in the case where at least one of the fuse elements FE1 through FE3 is in the cutting state, the analog value other than the typical value (for example, the maximum value or the minimum value, the value next to the typical value, or the like in the adjustment range) is outputted.

Figure 2A:
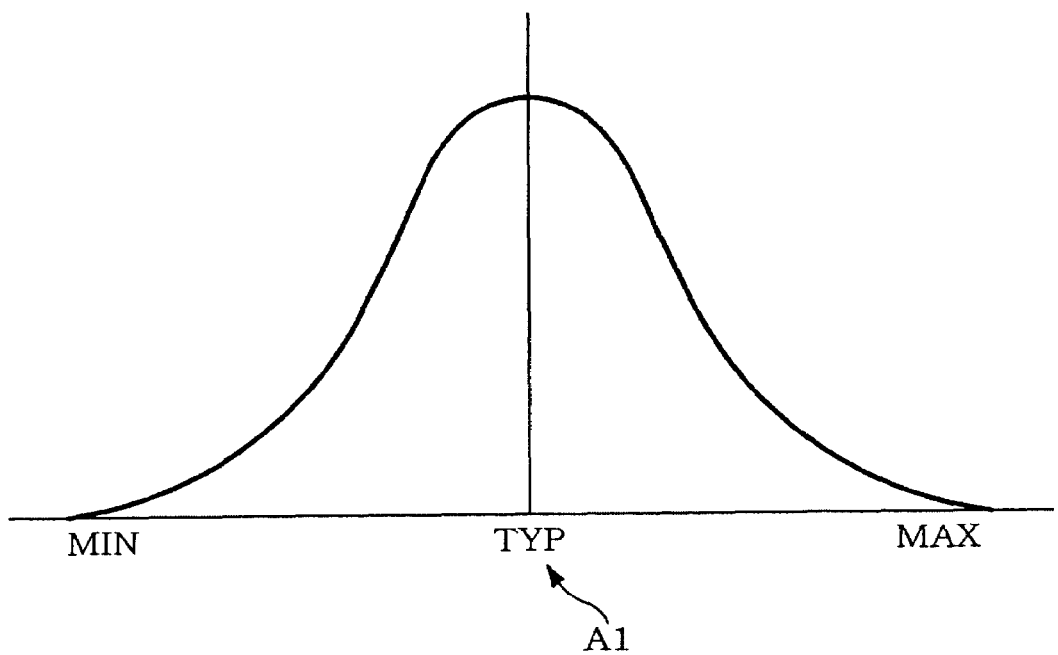
FIGS. 2(A) and (B) are explanatory diagrams of a method of adjusting the analog value according to an embodiment of the present embodiment.

That is, the analog value outputted from the analog value adjustment circuit 90 varies corresponding to the manufacturing process conditions and according to a normal distribution as shown in FIG. 2(A). Specifically, as shown in A1 of FIG. 2(A), it is the analog value having the highest occurrence frequency in a normal distribution of the analog value. Such analog value can be determined by monitoring the analog value when the manufacturing process conditions or the like are changed in the trial production stage or the like of the analog value adjustment circuit 90.

Then, according to the present embodiment, as shown in A2 of FIG. 2 (B), in the case where all the fuse elements FE1 through FE3 are in the non-cutting state (for example, when the fuse data FS1 through FS3 are (000)), the analog value output circuit 30 outputs an analog value (TYP) with the typical value having the highest occurrence frequency (appearance probability) in the normal distribution.

On the other hand, in the case where at least one of the fuse elements FE1 through FE3 is in the cutting state (for example, when the fuse data FS1 through FS3 are other than (000)), the analog value output circuit 30 outputs the analog value other than the typical value. Specifically, as shown in A3 and A4 of FIG. 2(B), in the case where the number of the fuse elements being in the cutting state is one (for example, when the fuse data FS1 through FS3 is (001) or (010)), the analog value output circuit 30 outputs the analog value which is made a value next to the typical value. Moreover, as shown in A5 and A6, in the case where the number of the fuse elements being in the cutting state, among the fuse elements FE1 through FE3, is many, for example, two or more (when the fuse data FS1 through FS3 is, for example, (101) or (111),) the analog value of the maximum value (MAX) or the minimum value (MIN) in the adjustment range is outputted.

Figure 2B:
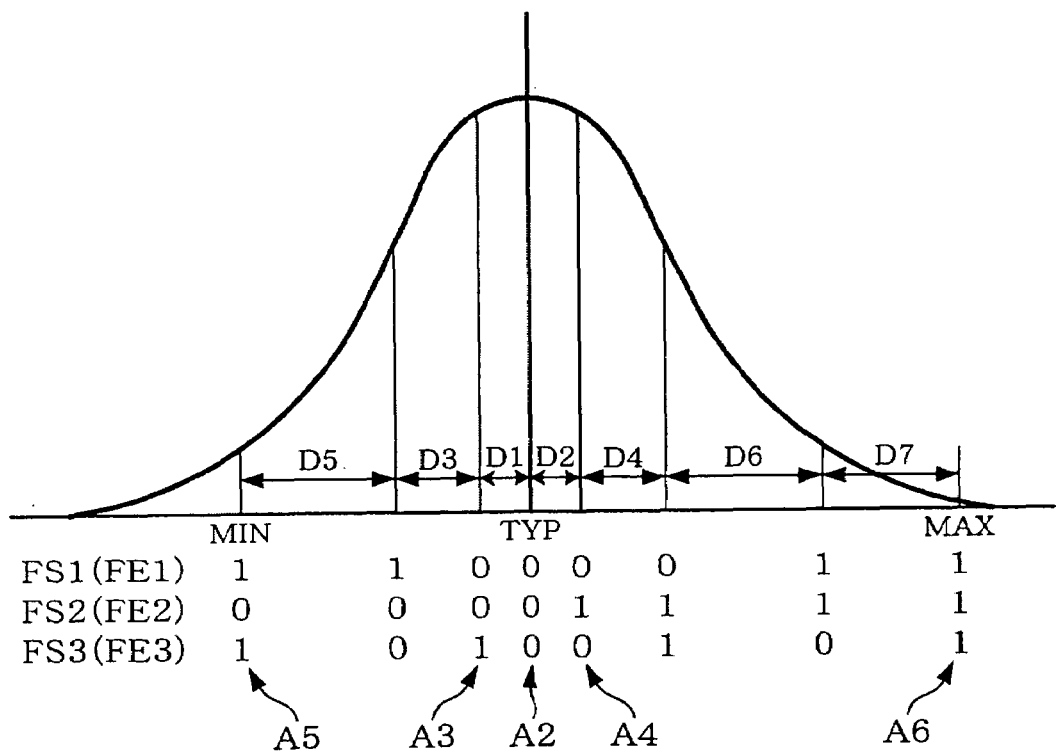

In this manner, at the time of mass production of the analog value adjustment circuit 90 (semiconductor integrated circuits, semiconductor chips), the probability that the analog value (TYP) with the typical value is outputted, as shown in A2 of FIG. 2(B), will be increased. Therefore, the probability that the cutting number of the fuse elements FE1 through FE3 becomes zero will be increased, the time for the cutting process of the fuse elements can be reduced, and lowering the circuit cost can be attained. Moreover, in the case where the number of the fuse elements being in the cutting state is one, the analog value which will be made a value next to the typical value (next just by one adjustment width amount), as shown in A3 and A4 of FIG. 2(B), is outputted. Accordingly, the probability that the cutting number of the fuse elements FE1 through FE3 becomes one or less will be increased, therefore, the time for the cutting process of the fuse elements can be reduced, and lowering the circuit cost can be attained.

Furthermore, according to the present embodiment, as shown in D1 through D7 of FIG. 2(B), the analog value output circuit 30 outputs the analog value so that the adjustment width thereof becomes narrower as being drawn closer to the typical value (TYP), and the adjustment width thereof becomes wider, as being drawn closer to the maximum (MAX) and the minimum value (MIN) in the adjustment range. That is, in FIG. 2(B), the adjustment width of D1 and D2, which are near to the typical value, is narrower as compared with the adjustment width of D5 and D7 which are near the minimum value or the maximum value. Accordingly, in the vicinity of the typical value, a high precision adjustment with a narrow adjustment width can be carried out, and the accuracy of the outputted analog value can be increased. Moreover, in the vicinity of the maximum value and the minimum value, by ending up with a wider adjustment width, the number of bits of the fuse elements or the fuse data can be reduced, and the simplification and the miniaturization of the structure of the circuit can be attained, as a result.

2. Ladder Resistor Circuit and Select Circuit

As shown in FIG. 1, according to the present embodiment, the analog value adjustment circuit 30 can include a ladder resistor circuit 40 and a select circuit 50.

The ladder resistor circuit 40 is a circuit containing a plurality of resistor elements that are series-coupled (there may be a portion in parallel-coupling) between a first node and a second node. In other words, the ladder resistor circuit 40 (voltage dividing circuit) is the circuit which divides the voltage between the first node voltage and the second node voltage, and outputs the dividing voltage to the first through the Kth taps (dividing terminals).

The select circuit 50 is a circuit that selects any one of the first through Kth taps (K is an integer of 2 or more) of the ladder resistor circuit 50 based on the fuse data FS1 through FS3 from the fuse circuit 10, and adjusts the analog value. For example, based on the voltage obtained by this selection, the analog value is outputted.

Then, according to the present embodiment, in the case where the fuse data FS1 through FS3 is the data indicating that all the fuse elements FE1 through FE3 are in the non-cutting state (when the fuse data FS1 through FS3 is (000)), the select circuit 50 selects the Lth tap in the middle (L is an integer of 1<L<K) corresponding to the typical value. By doing it this way, in the case where all the fuse elements FE1 through FE3 are in the non-cutting state, the analog value with the typical value will be outputted from the analog value output circuit 30.

Figure 3:
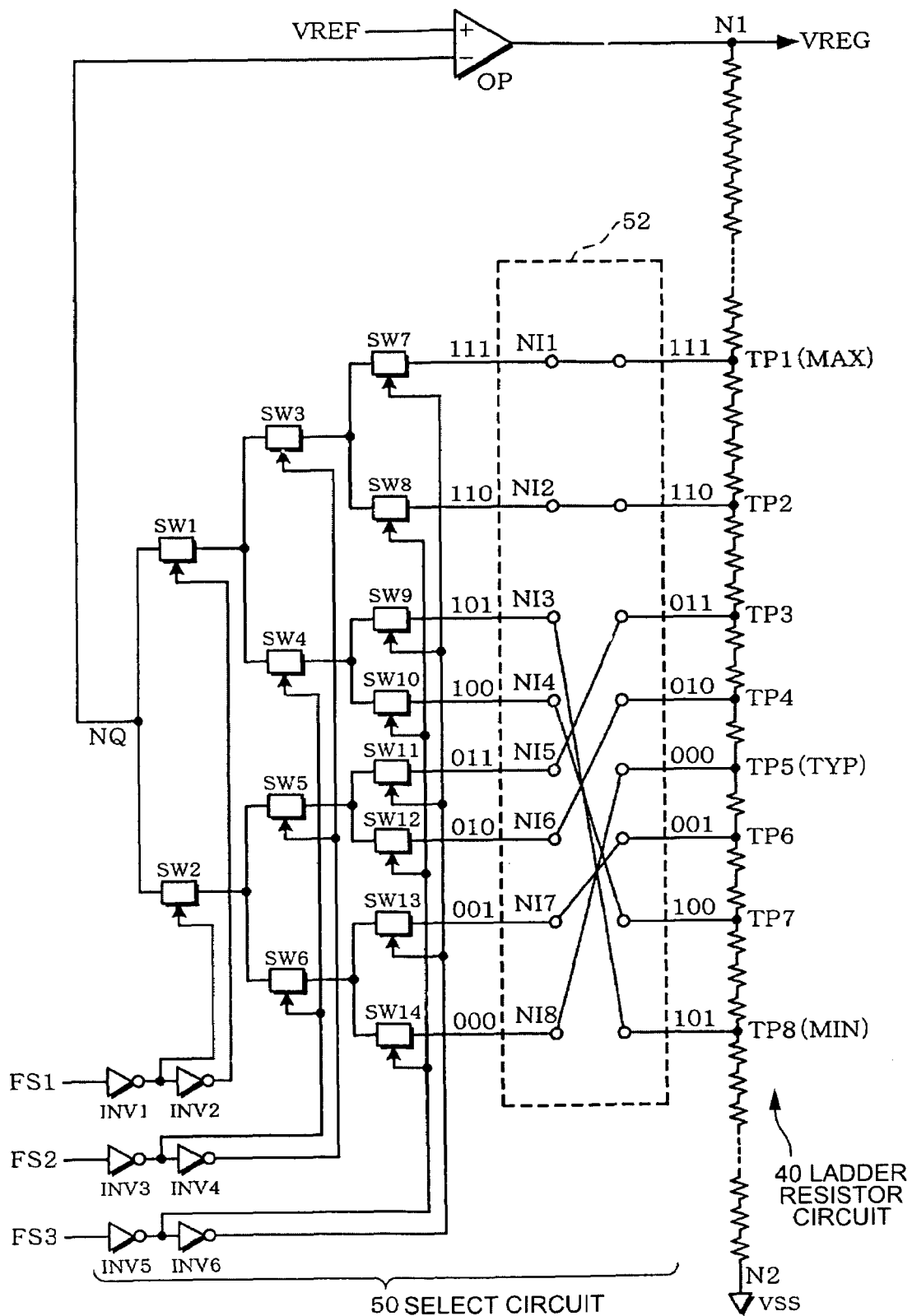
FIG. 3 is an example of a structure of a select circuit and a ladder resistor circuit according to an embodiment of the present invention.

An example of a specific structure of the ladder resistor circuit 40 and the select circuit 50 is shown in FIG. 3. As shown in FIG. 3, the ladder resistor circuit 40 has a plurality of resistor elements that are series-coupled between a first node N1 and a second node N2, and taps TP1 through TP8 (in a broad sense, first through Kth taps). In addition, the resistor elements may be constituted by polysilicone resistors or diffusion resistors, or may be constituted by on-resistance of transistors. Moreover, circuit elements (switching elements or the like) other than the ones shown in FIG. 3 may be included in the ladder resistor circuit 40.

The select circuit 50 contains a plurality of switching elements (analog switches) SW1 through SW14. These switching elements SW1 through SW14 are on-off controlled by the fuse data FS1 through FS3. Specifically, based on signals which are the buffered signals and the inverted signals of the fuse data FS1 through FS3 by inverter circuits INV1 through INV6, the switching elements SW1 through SW14 are on-off controlled.

Then, the select circuit 50 selects any one of the select input nodes NI1 through NI8 to couple to an output node NQ by on-off controlling the switching elements SW1 through SW14 based on the fuse data FS1 through FS3. Specifically, when the fuse data FS1 through FS3 is (000) (in the case where all the bits of the fuse data are at a first logic level), the switching elements SW14, SW6, and SW2 are turned on, and the select input node NI8 is selected to be coupled to the output node NQ. When the fuse data FS1 through FS3 is (001), the switching elements SW13, SW6, and SW2 are turned on, and the input node NI7 is coupled to the output node NQ. When the fuse data FS1 through FS3 is (010), the switching elements SW12, SW5, and SW2 are turned on, and the input node NI6 is coupled to the output node NQ. When the fuse data FS1 through FS3 is (011), the switching elements SW11, SW5, and SW2 are turned on, and the input node NI5 is coupled to the output node NQ. When the fuse data FS1 through FS3 is (100), the switching elements SW10, SW4, and SW1 are turned on, and the input node NI4 is coupled to the output node NQ. When the fuse data FS1 through FS3 is (101), the switching elements SW9, SW4, and SW1 are turned on, and the input node NI3 is coupled to the output node NQ. When the fuse data FS1 through FS3 is (110), the switching elements SW8, SW3, and SW1 are turned on, and the input node NI2 is coupled to the output node NQ. When the fuse data FS1 through FS3 is (111) (when all the bits of the fuse data are at a second logic level), the switching elements SW7, SW3, and SW1 are turned on, and the input node NI1 is coupled to the output node NQ.

In addition, the switching elements SW1 through SW14 can be, for example, realized by transfer gates in which the source electrodes and the drain electrodes of a N-type (in a broad sense, a first conduction type) transistors and a P-type (in a broad sense, a second conduction type) transistors connected in common. Or the switching elements SW1 through SW14 may be constituted by only the N type transistors or only the P type transistors.

Figure 4:
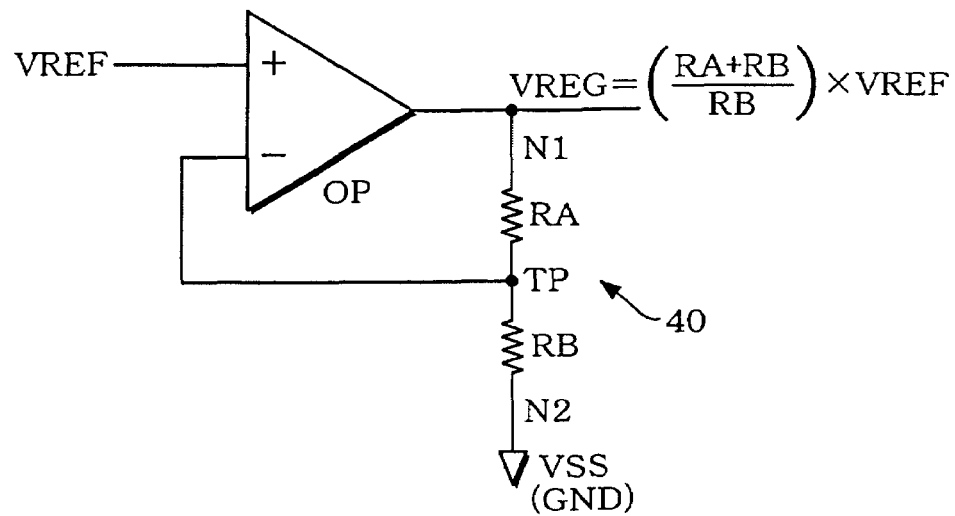
FIG. 4 is an explanatory diagram with respect to voltage adjustment according to an embodiment of the present invention.

The output node NQ of the select circuit 50 is coupled to a second differential input (minus side) of an Op-amp OP (operational amplifier), to a first differential input (plus side) of which a voltage reference VREF is coupled. Then, the Op-amp OP, whose output is coupled to the node N1, outputs an adjusted voltage VREG (in a broad sense, the analog value) to the node N1. Namely, as shown in FIG. 4, the adjusted voltage VREG which satisfies the equation of VREG={(RA+RB)/RB}×VREF is outputted. In addition, in FIG. 4, RA is the resistance of the resistor elements between the node N1 and the tap TP selected by the select circuit 50, and RB is the resistance of the resistor elements between the tap TP and the node N2. Namely, when the select circuit 50 of FIG. 3 selects a tap TP5, the resistance between the node N1 and the tap TP5 becomes RA, and the resistance between the tap TP5 and the node N2 becomes RB.

The select circuit 50 includes wiring 52. This wiring 52 couples any one of the select input nodes NI1 through NI8 of the select circuit 50, to any one of the taps TP1 through TP8 of the ladder resistor circuit 40. Specifically, in FIG. 3, the select input nodes NI1, NI2, NI3, NI4, NI5, NI6, NI7, and NI8 are coupled to the taps TP1, TP2, TP8, TP7, TP3, TP4, TP6, and TP5, respectively, by the wiring 52.

As shown in FIG. 3, the select circuit 50 according to the present embodiment selects the tap TP5 (in a broad sense, the Lth tap) corresponding to the typical value, when the fuse data FS1 through FS3 is (000) (in a broad sense, in the case where the fuse data is the data indicating that all the fuse elements are in the non-cutting state). Namely, when the fuse data FS1 through FS3 is (000), the switching elements SW2, SW6, and SW14 are turned on, the select input node NI8 coupled to the tap TP5 is selected to couple to the output node NQ. Accordingly, the analog value output circuit 30 will output, to the node N1, the adjusted voltage VREG with the typical value.

For example, assume that the reference voltage in the typical condition is VREF=1.0V, and that the typical value of the adjusted voltage VREG having the highest occurrence frequency is VREG=2.0V in the normal distribution of FIGS. 2(A) and (B). In this case, the tap in the middle of the nodes N1 and N2 are set to the tap TP5 corresponding to the typical value. Namely, in FIG. 4, a tap that makes RA=RB is set to the tap with the typical value. Which tap is to be set to the tap with the typical value is determined, for example, at the time of the trial production of the products (semiconductor integrated circuits including the analog value adjustment circuit).

Then, during mass production, the occurrence frequency of the products which output VREG=2.0V, which is the adjusted voltage with the typical value, increases. Accordingly, for a number of products which output VREG=2.0V, the select circuit 50 may just select the tap TP5 when the fuse data FS1 through FS3 is (000), thereby ending up without cutting the fuse elements FE1 through FE3. As a result, the time for cutting process of the fuse elements can be reduced.

Moreover, in FIG. 3, the positions of the taps TP1 through TP8 are set up so that the resistance of the resistor elements between taps becomes larger as being drawn closer to the tap TP1 or TP8 (first or Kth tap), and the resistance between taps becomes lower as being drawn closer to the tap TP5 (Lth tap) corresponding to the typical value. For example, in FIG. 3, the resistances of the resistor elements between taps TP1 and TP2 and between TP7 and TP8 are high. On the other hand, the resistances between taps TP4 and TP5 and between TP5 and TP6 are low. If doing this way, as described in FIG. 2(B), the adjusted voltage VREG (analog value), which is to be adjusted so that the adjustment width becomes larger as being drawn closer to the maximum value or the minimum value in the adjustment range, and the adjustment width becomes narrower as being drawn closer to the typical value, can be outputted. Accordingly, even if the number of bits of the fuse elements or the fuse data is small, high precision voltage adjustment can be realized.

Moreover, according to the present embodiment, when the fuse data FS1 through FS3 is (010) or (001) (in a broad sense, in the case where the fuse data is the data indicating that only one of the fuse elements is in the cutting state), the select circuit 50 is made to select the tap TP4 or TP6 that is next to the tap TP5 corresponding to the typical value. For example, assume that the adjusted voltage VREG deviates from the typical value of 2.0V, because of the variation of the manufacturing process conditions or the like. In this case, by cutting at least one of the fuse elements FE1 through FE3 and having the select circuit 50 select a tap other than the tap TP5 with the typical value, the VREG voltage will be adjusted. Also in this case, as apparent from the normal distribution of FIGS. 2(A) and (B), at the time of mass production or the like of the products, the probability that the tap TP4 or TP6, which is near the tap TP5 with the typical value, is selected is high. Accordingly, if the tap, which is selected by the select circuit 50 when the fuse data FS1 through FS3 is (010) or (001), is set to these taps TP4 and TP6, the number of cutting the fuse elements can be done with one or less, and the time reduction of the cutting process of the fuse elements can be realized.

In addition, as for the wiring 52 of FIG. 3, it is desirable that the wiring coupling pattern thereof can be changed by a mask change (for example, a wiring layer mask or a contact layer mask). Namely, in FIG. 3, the tap corresponding to the typical value is set to the tap TP5 in the exact center between the nodes N1 and N2. However, the reference voltage VREF in the typical condition sometimes deviates from 1.0 V due to, for example, the changes of the process parameters or the like. Even in this case, this can be coped with by changing the wiring coupling pattern of the wiring 52 by the mask change.

Namely, in the case where the reference voltage VREF becomes high, for example, the tap TP4 above TP5 is set to the tap corresponding to the typical value. Namely, the mask change with respect to the wiring 52 is made so that the tap TP4 is coupled to the select input node NI8 when FS1 through FS3 is (000). On the other hand, in the case where the reference voltage VREF is low, for example, the tap TP6 under the TP5 is set to the tap corresponding to the typical value. Namely, the mask change with respect to the wiring 52 is made so that the tap TP6 is coupled to the select input node NI8. Accordingly, just by making the mask change with respect to the wiring 52, the variation of the reference voltage due to the process parameter changes or the like can be coped with easily.

In addition, the analog value adjusted by the analog value adjustment circuit 90 of the present embodiment is not limited to the voltage value such as the adjusted voltage VREG. For example, the value of the current flowing in a constant current source may be an adjustment target of the analog value adjustment circuit 90. Or an oscillation frequency, such as a clock, may be the adjustment target. An example of a structure in such case is shown in FIG. 5.

Figure 5:
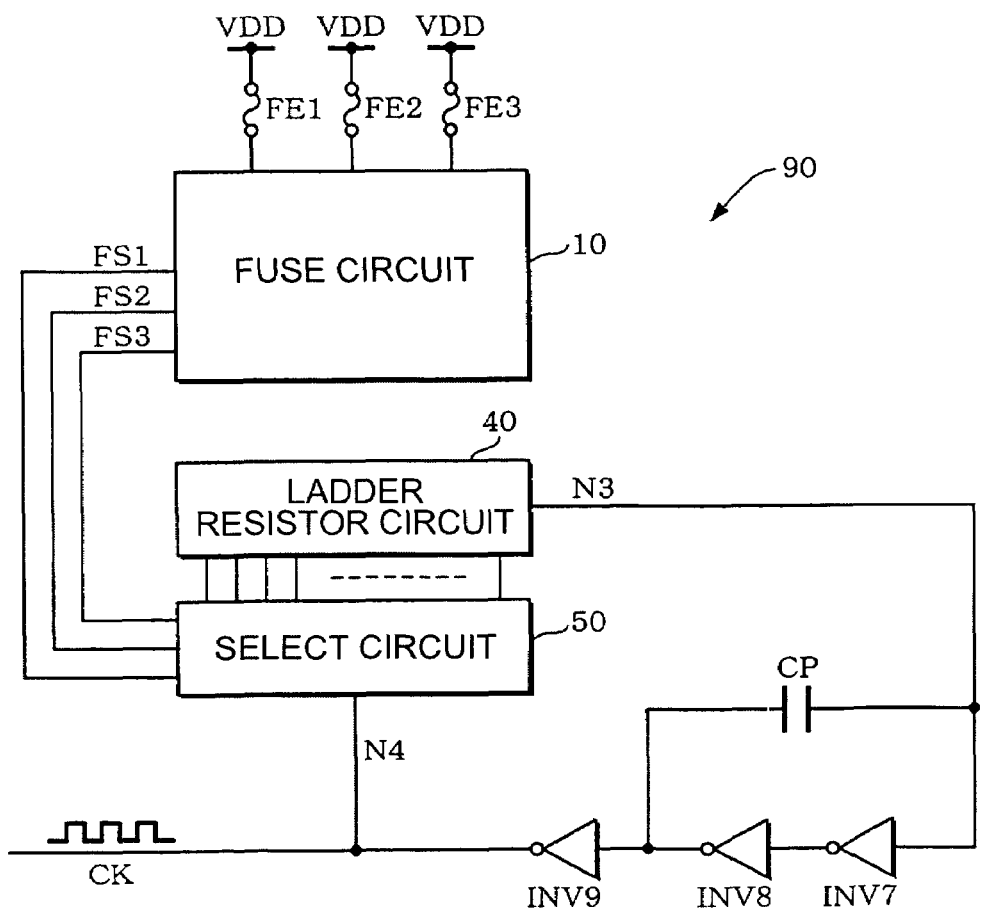
FIG. 5 is a modification of the analog value adjustment circuit according to an embodiment of the present invention.

In FIG. 5, the oscillation frequency of a clock signal CK is determined based on the capacitance value of a capacitor CP, and the resistance of the ladder resistor circuit 40. Then, the fuse circuit 10 outputs, to the select circuit 50, the fuse data FS1 through FS3 whose value changes corresponding to the setup states (cutting/non-cutting state) of the fuse elements FE1 through FE3. The select circuit 50 selects, based on the fuse data FS1 through FS3, any one of the taps of the ladder resistor circuit 50 using the switching elements having the structure described in FIG. 3. Accordingly, the resistance between a node N3 and a node N4 is adjusted variably, and the oscillation frequency (in a broad sense, analog value) of the clock signal CK can be adjusted.

Then, also in FIG. 5, the select circuit 50, in the case where the fuse data FS1 through FS3 of is (000) (in the case where all the fuse elements FE1 through FE3 are in the non-cutting state), selects the tap corresponding to the typical value among the taps of the ladder resistor circuit 40. By doing this way, at the time of mass production, in a number of products, even if the fuse elements FE1 through FE3 are not cut, the oscillation frequency with the typical value can be obtained, and the time reduction in the cutting process (inspection process) of the fuse elements can be realized.

3. Fuse Circuit

Figure 6:
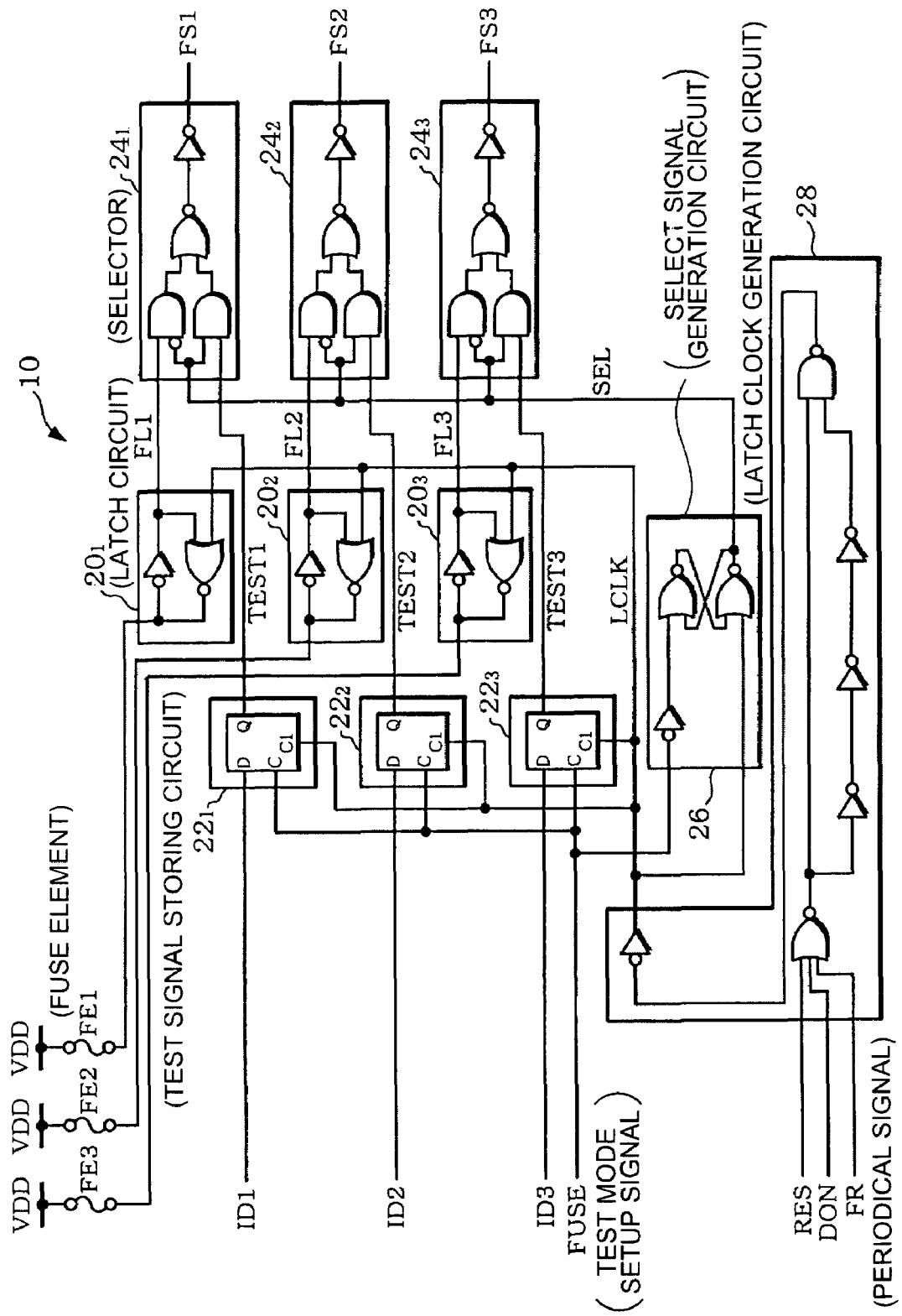
FIG. 6 is an example of a structure of a fuse circuit according to an embodiment of the present invention.

In FIG. 6, an example of a detailed structure of the fuse circuit 10 is shown. In addition, the fuse circuit 10 of the present embodiment is not limited to the structure of FIG. 6, and may be constituted excluding the test circuit (test signal storing circuit or selector) or the like.

The fuse circuit 10 can include latch circuits $20_1$ through $20_3$, test signal storing circuits $22_1$ through $22_3$, and selectors $24_1$ through $24_3$. One end of each fuse element is coupled to a power supply VDD (first power supply). Moreover, at the other end of each fuse element, the latch circuit is coupled, respectively. Accordingly, in the state that the fuse element is not cut (blown out), the voltage at the other end of the fuse element is almost VDD.

The latch circuits $20_1$ through $20_3$ take in a logic level (in a broad sense, setup state of the fuse element) corresponding to the voltage at the other ends of the fuse elements FE1 through FE3, and output the fuse latch data FL1 through FL3. For example, in the state that the fuse element FE1 is not cut, the latch circuit $20_1$ keeps a logic level "1" (H level), and outputs a logic level "0" (L level) as the fuse latch data FL1. Moreover, in the state that the fuse element FE1 is cut, the latch circuit $20_1$ keeps a logic level "0" corresponding to the voltage at the other end of the fuse element FE1, which is made in a open state by cutting, and outputs a logic level "1" as the fuse latch data FL1. The latch circuits $20_2$ and $20_3$ keep the logic level corresponding to the cutting state of the fuse elements FE2 and FE3 in the same way.

Incidentally, the fuse elements FE1 through FE3 cannot be restored, once having been cut. So, in the fuse circuit 10 of FIG. 6, by using test signal ID1 through ID3 for confirming in advance whether or not the analog value, which is adjusted based on the setup state of the fuse elements FE1 through FE3, is acceptable, states equivalent to the states of having the fuse elements FE1 through FE3 cut can be produced. For this reason, in the test signal storing circuits $22_1$ through $22_3$, the test signal ID1 through ID3 is stored based on a test mode setup signal FUSE, and test latch data TEST1 through TEST3 are outputted. Then, in selectors $24_1$ through $24_3$, by switching from the fuse latch data FL1 through FL3 to the test latch data TEST1 through TEST3 based on a select signal SEL, the fuse data FS1 through FS3 are outputted.

Then, the present embodiment is constituted so that the analog value corresponding to each state of a maximum of 8 states, which are determined by the fuse data FS1 through FS3, is adjusted. By doing this way, fine adjustment of the maximum of 8 patterns corresponding to the setup states of the fuse element can be attained, and test states equivalent to the setup states can be made in advance. In the fuse circuit 10, by switching the select signal SEL generated using the test mode setup signal FUSE, the above-described test state can be set.

More specifically, the fuse circuit 10 includes a select signal generation circuit 26 which generates the select signal SEL. The select signal generation circuit 26 includes an RS flip flop. The RS flip flop generates the select signal SEL, with the inverted signal of the test mode setup signal FUSE being a set signal, and with the latch clock LCLK being a reset signal.

Furthermore, the fuse circuit 10 includes a latch clock generation circuit 28 which generates the latch clock LCLK. The latch clock generation circuit 28 includes a rising-edge detection circuit. Namely, the latch clock generation circuit 28 generates the latch clock LCLK having a pulse width corresponding to the delay time of three stages of the inverter sequence, with reference to the rising of an input signal.

For example, in the case where the fuse circuit is applied to a display driver circuit that drives a liquid crystal panel, when a reset signal RES or a display-on signal DON changes from a logic level "1" to "0", the latch clock LCLK can be generated. Here, the reset signal RES is a pulse signal which is made active (logic level "1") by a hardware reset. Moreover, the display-on signal DON is a signal which turns on the display of a display panel. At the time of the display-on, at the segment output and the common output, a level corresponding to a display data and a display timing is outputted.

Figure 7:
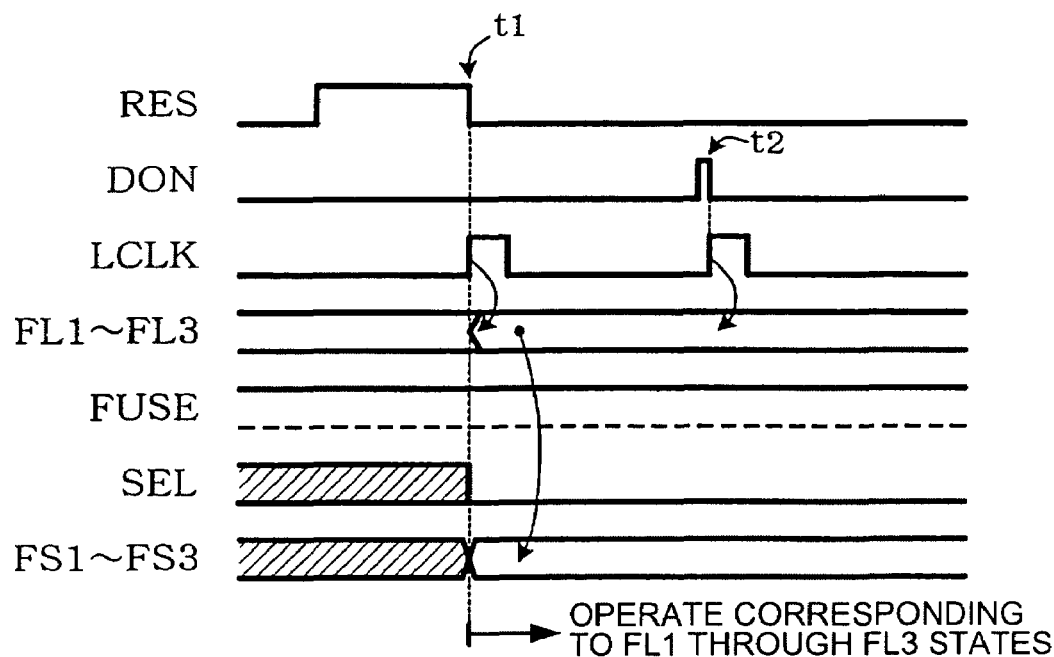
FIG. 7 is a timing chart explaining the operation of the fuse circuit according to an embodiment of the present invention.

An example of the operational timing of the fuse circuit 10 is shown in FIG. 7. In FIG. 7, the logic level of the test mode setup signal FUSE is kept in the state of "1", and the case of not shifting to the test mode is shown.

In the fuse circuit 10, any one of the fuse elements FE1 through FE3 is cut, and the setup state of the fuse elements is stored in the latch circuits $20_1$ through $20_3$. The latch circuits $20_1$ through $20_3$ output the fuse latch data FL1 through FL3 corresponding to the stored content.

When the logic level of the reset signal RES is set to "1" by the hardware reset and then the logic level is set to "0" (t1), the latch clock LCLK is generated by the latch clock generation circuit 28. The latch circuits $20_1$ through $20_3$ take in, again, the logic level corresponding to the voltage at the other ends of the fuse elements FE1 through FE3, with this latch clock LCLK. Moreover, the select signal generation-circuit 26 sets the logic level of the select signal SEL to "0." Accordingly, selectors $24_1$ through $24_3$ select the fuse latch data FL1 through FL3 stored in the latch circuits $20_1$ through $20_3$, and output as the fuse data FS1 through FS3.

Then, the display-on command is executed, and the logic level of the display-on signal DON is set to "1." Then, when the logic level is set to "0" (t2), the latch clock LCLK is generated by the latch clock generation circuit 28. The latch circuits $20_1$ through $20_3$ take in, again, the logic level corresponding to the voltage at the other ends of the fuse elements FE1 through FE3, with this latch clock LCLK.

Figure 8:
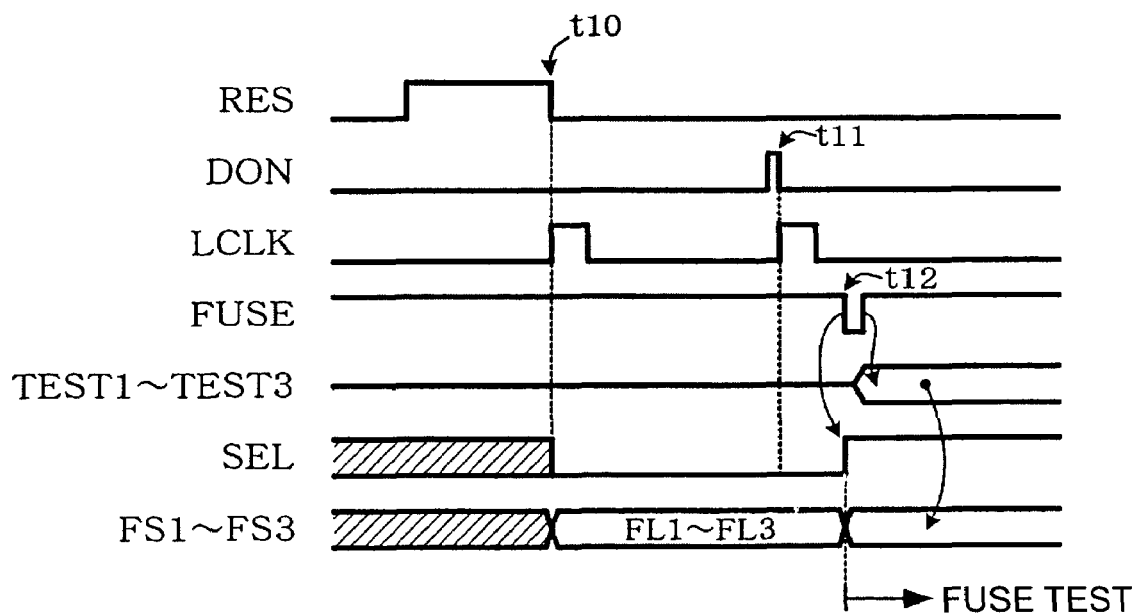
FIG. 8 is a timing chart explaining other example of the operation of the fuse circuit according to an embodiment of the present invention.

In FIG. 8, another example of the operational timing of the fuse circuit 10 is shown. In FIG. 8, a case of shifting to the test mode by the input of the pulse, whereby the logic level of the test mode setup signal FUSE is set to "0", is shown.

In the fuse circuit 10, any one of the fuse elements FE1 through FE3 is cut, and the setup state of the fuse elements is stored in the latch circuits $20_1$ through $20_3$. The latch circuits $20_1$ through $20_3$ output the fuse latch data FL1 through FL3 corresponding to the stored content. Accordingly, by the fuse latch data FL1 through FL3, the adjustment of the analog value will be carried out (normal operation mode).

When the logic level of the reset signal RES is set to "1" by the hardware reset and then the logic level is set to "0" (t10), the latch clock LCLK is generated by the latch clock generation circuit 28. The latch circuits $20_1$ through $20_3$ take in, again, the logic level corresponding to the voltage at the other ends of the fuse elements FE1 through FE3, with this latch clock LCLK. Moreover, the select signal generation circuit 26 sets the logic level of the select signal SEL to "0." Accordingly, the selectors $24_1$ through $24_3$ select the fuse latch data FL1 through FL3 stored in the latch circuits $20_1$ through $20_3$, and output as the fuse data FS1 through FS3.

Then, the display-on command is executed, and the logic level of the display-on signal DON is set to "1." Next, when the logic level is set to "0" (t11), the latch clock LCLK is generated by the latch clock generation circuit 28. The latch circuits $20_1$ through $20_3$ take in, again the logic level corresponding to the voltage at the other ends of the fuse elements FE1 through FE3, with this latch clock LCLK.

Then, when a pulse of the test mode setup signal FUSE is inputted (t12) in order to shift to the test mode, the test signal ID1 through ID3 is latched to the test signal storing circuits $22_1$ through $22_3$ by the rising edge of the test mode setup signal FUSE. The test signal storing circuits $22_1$ through $22_3$ output the test latch data TEST1 through TEST3. Moreover, the logic level of the select signal SEL is set to "1" in the select signal generation circuit 26. Accordingly, the selectors $24_1$ through $24_3$ select the test latch data TEST1 through TEST3 stored in the test signal storing circuits $22_1$ through $22_3$, and output as the fuse data FS1 through FS3. Accordingly, the adjustment of the analog value will be carried out by the test latch data TEST1 through TEST3 (test mode).

Incidentally, in the fuse circuit 10 of the present embodiment, as shown in FIG. 6, a periodic signal (frame signal FR in FIG. 6) other than the reset signal RES and the display-on signal DON is also inputted to the latch clock generation circuit 28. Then, the present embodiment is characterized by taking in the setup state of the fuse elements, again, to the latch circuits $20_1$ through $20_3$, with a latch clock CLK generated by the periodic signal. Here, the frame signal FR is a signal which changes for every frame. By this frame signal FR, the voltage applied to a liquid crystal can be inverted, or the alternating current signal (polarity inverting signal), which inverts the voltage applied to the liquid crystal based on the frame signal FR, can be generated.

Hereinafter, the reason why the periodic signal is required for the latch clock generation circuit 28 in the fuse circuit 10 will be described using FIGS. 9 (A), (B), and FIGS. 10(A) and (B).

FIG. 9(A) is an example of a timing chart in the case where the content of the fuse latch data FL1 changes to cause a wrong operation. FIG. 9(B) is an example of the timing chart in the case where a normal operation can be obtained with the periodic signal, even if the content of the fuse latch data FL1 changes. Here, only the fuse latch data FL1 is shown, however, the fuse latch data FL2 and FL3 are the same.

In FIG. 9(A), a pulse for the reset signal RES is generated by the hardware reset (t20), and then a pulse for the display-on signal DON is generated by the display-on command executed by a user (t21). Then, the latch circuits $20_1$ through $20_3$ take in, again, the logic level corresponding to the voltage at the other ends of the fuse elements FE1 through FE3, with the latch clock LCLK.

For example, after the pulse generation of the display-on signal DON, external noises, such as static electricity, put on the other end, which is in an open state, of the fuse element FE1, and as a result, there are cases where the stored content of the latch circuit $20_1$ changes (t22). In this case, the fuse latch data FL1 will also change from a logic level "0" to "1." Accordingly, because of the fuse data FS1 outputted by the fact that the fuse latch data FL1 is selected in the selector $24_1$, there is a possibility that the analog value, which should be adjusted, changes to cause a wrong operation.

On the other hand, according to the present embodiment shown in FIG. 9(B), even after the pulse generation of the display-on signal DON, the latch clock LCLK is periodically generated (t23, t24, t25) by the frame signal FR. Accordingly, by the latch clock CLK that is generated at timings t23, t24, and t25, the setup state of the fuse elements will be taken in to the latch circuit. For this reason, by the latch clock LCLK that is generated at the timing t25 after the wrong operation generation timing t22 shown in FIG. 9(A), the setup state of the fuse element FE1 is taken in to the latch circuit $20_1$. Accordingly, the stored content of the latch circuit $20_1$ returns to a logic level "1", returns to a logic level "0" of the fuse latch data FL1, and then can be returned to the normal operation.

FIG. 10(A) is an example of a timing chart in the case where noise overlaps on the test mode setup signal FUSE and causes a wrong operation. FIG. 10(B) is an example of a timing chart in the case where a normal operation can be obtained with the periodic signal even if the noise overlaps on the test mode setup signal FUSE.

In FIG. 10(A), a pulse of the reset signal RES is generated by the hardware reset (t30), and then a pulse of the display-on signal DON is generated by the display-on command executed by a user (t31). Then, the test latch data TEST1 through TEST3 stored in the test signal storing circuits $22_1$ through $22_3$ are outputted as the fuse data FS1 through FS3.

For example, after the pulse generation of the display-on signal DON, there are cases where external noises, such as static electricity, put on the test mode setup signal FUSE, and as a result, the test mode setup signal FUSE is set to a logic level "0" (t32). In this case, in the select signal generation circuit 26, the logic level of the select signal SEL will change from "0" to "1." Accordingly, despite having no intention to shift to the test mode, in the selectors $24_1$ through $24_3$, the test latch data TEST1 through TEST3 are outputted as the fuse data FS1 through FS3, and the analog value, which should be adjusted, will change and cause a wrong operation.

On the other hand, according to the present embodiment shown in FIG. 10(B), even after the pulse generation of the display-on signal DON, the latch clock LCLK is periodically generated (t33, t34, t35) by the frame signal FR. Accordingly, by the latch clock LCLK generated at the timing t34 after the wrong operation generation timing t32 as shown in FIG. 10(A), it returns to the logic level "0" of the select signal SEL that is generated in the select signal generation circuit 26. Accordingly, it can be returned to the normal operation, with the test latch data TEST1 through TEST3, as the fuse data FS1 through FS3, not being outputted.

Thus, in FIG. 6, because the latch clock LCLK is generated using the periodic signal, the above described wrong operation can be avoided regardless of the execution timing of the display-on command depending on a user after the hardware reset.

Figure 11:
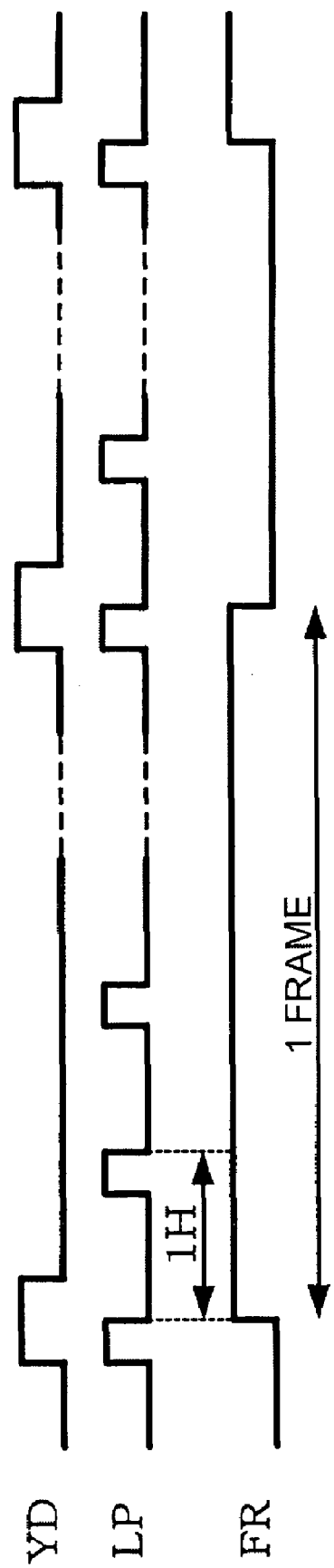
FIG. 11 is a view showing other example of the periodic signal according to an embodiment of the present invention.

In addition, the periodic signal is not limited to the frame signal FR shown in FIG. 6. For example, as for the periodic signal, a start pulse signal YD, a latch pulse signal LP as shown in FIG. 11, a boost clock, or the like can be employed. Here, the start pulse signal YD is a pulse signal which indicates the front of a frame. The latch pulse signal LP is a signal which regulates one horizontal scanning period. The boost clock is a timing signal required for a charge pump type boost circuit which generates a high voltage necessary for the drive of the liquid crystal panel. Moreover, it is desirable that the periodic signal is a signal having a longer cycle rather than an internal clock having a short cycle. This is because at the time of taking in the setup state of the fuses of the latch circuit, a lower frequency than a shoot-through current flows is advantageous in terms of lowering the power consumption.

4. Display Driver Circuit

Figure 12:
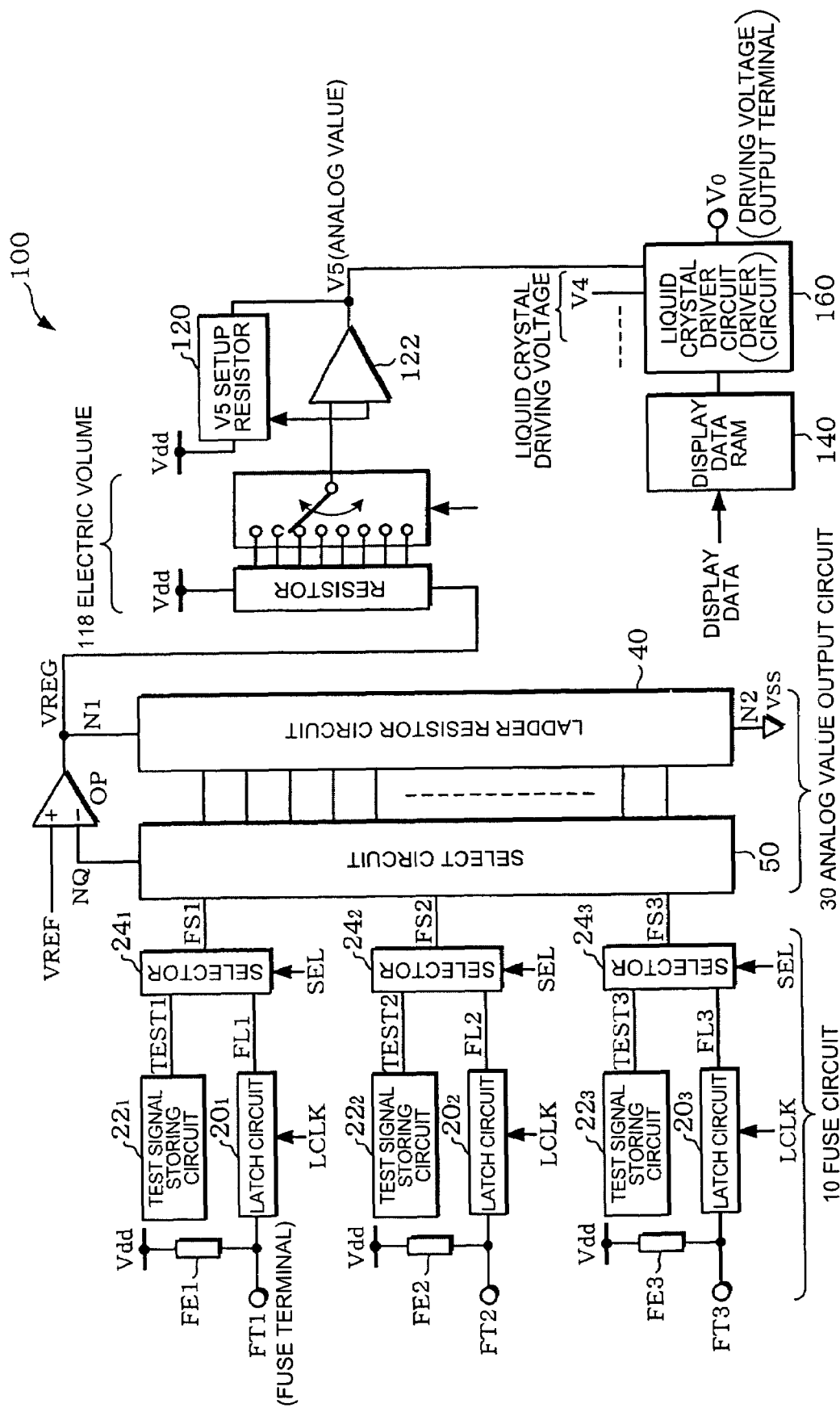
FIG. 12 is an example of a structure of a display driver circuit according to an embodiment of the present invention.

In FIG. 12, an example of a structure of a display driver circuit, to which the analog value adjustment circuit of the present embodiment is applied, is shown. FIG. 12 shows an example of the case where the adjustment target of the analog value adjustment circuit is a liquid crystal driving voltage V5, however, a liquid crystal driving voltage V4 or the like can be made the adjustment target.

As for the fuse elements FE1 through FE3, one end is coupled to a system power supply VDD, and the other end is coupled to fuse terminals (in a broad sense, external terminals) FT1 through FT3. By providing a voltage to the fuse terminal FT1, a high voltage can be applied to both ends of the fuse element FE1, and the fuse element FE1 can be cut. In the same way, by providing a voltage to the fuse terminals FT2 and FT3, the fuse elements FE2 and FE3 can be cut.

The fuse data FS1 through FS3 from the fuse circuit 10 is inputted to the select circuit 50. Then, as described above, the select circuit 50 selects any one of the taps of the ladder resistor circuit 40 based on the fuse data FS1 through FS3, and couples the tap to the node NQ. Accordingly, as described in FIG. 3 and FIG. 4, the adjusted voltage VREG (analog value) is outputted to an output node N1 of the Op-amp OP.

Then, based on the outputted adjusted voltage VREG, the liquid crystal driving voltage V5 (in a broad sense, analog value) can be fine-adjusted by an electronic volume 118 and a V5 setup resistor 120, and an Op-amp 122, and by switching control by software.

A display driver circuit 100 can further include a display data RAM 140 and a liquid crystal driver circuit (in a broad sense, driver circuit) 160. The display data RAM 140, for example, stores one frame of display data. The liquid crystal driver circuit 160 outputs, to a driving-voltage output terminal (in a broad sense, external terminal) V0, the liquid crystal driving voltage (V5, V4, etc.) corresponding to the display data. Thus, in the case where the fuse circuit 10 according to the present embodiment is applied to the display driver circuit, the setup state of the fuse element can be periodically taken in, as described above, simply by diverting a periodic signal required for the display control.

Accordingly, without increasing the circuit scale and without being influenced by external noises, fine adjustment of the analog value using the fuse elements can be attained.

5. Method of Adjusting the Analog Value

Next, a method of adjusting the analog value using the analog value adjustment circuit according to the present embodiment will be described using a flow chart of FIG. 13.

First of all, in a test mode (mode in which selectors $24_1$ through $24_3$ select test latch data TEST1 through TEST3) using a test circuit (test signal storing circuits $22_1$ through $22_3$, selectors $24_1$ through $24_3$, and the like of FIG. 6), the fuse data is set up (step S1). Then, the analog value outputted from the analog value adjustment circuit is monitored with a tester or the like, and the monitored valued is memorized and stored in a memory of the tester (step S2). Then, whether the monitoring of all the setup states (cutting state and non-cutting state) of the fuse elements is completed or not is judged (step S3), and if not completed, it returns to step S1 to set up a next combination of the fuse data. Namely, by using the test circuit, a combination of the fuse data such as, (000), (001), (010), - - - (011), (111), are set up sequentially, and the analog value at that time is monitored sequentially.

Next, the monitored value stored in the memory of the tester is compared with a target value, and the setup state (cutting state and non-cutting state) of the fuse elements at the time of outputting the analog value, which is nearest to the target value, is determined (step S4). In addition, by using a binary search method or the like, not by the method of comparing the monitored value with the target value with respect to all the combinations of the fuse data like in steps S1 through S4, the setup state of the fuse elements at the time of outputting the analog value, which is the nearest to the target value, may be determined.

Next, in step S4, the fuse elements are cut as to be in a determined setup state (step S5). Then, in the normal operation mode (mode in which the selectors $24_1$ through $24_3$ of FIG. 6 select fuse latch data FL1 through FL3) using the fuse elements after the cutting, the analog value outputted from the analog value adjustment circuit is monitored with the tester (step S6). Then, whether or not the analog value to be outputted is in an acceptable range as compared with the target value is judged (step S7), and if it is in the acceptable range, the product is judged as accepted (pass) (step S8), and if it is not in the acceptable range, the product is judged as rejected (fail) (step S9). The inspection process is completed as described above.

Figure 13:
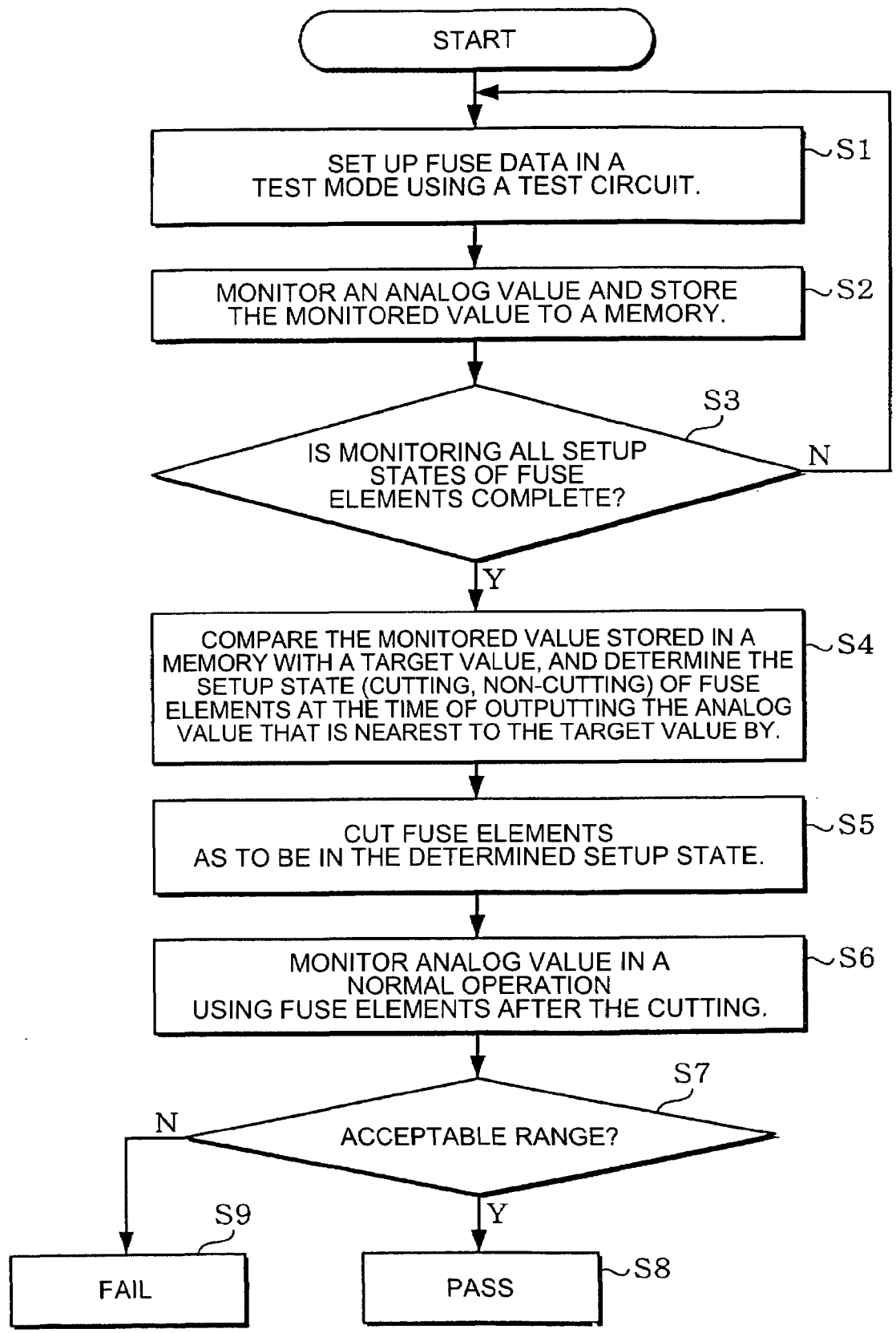
FIG. 13 is a flow chart explaining a method of adjusting the analog value according to an embodiment of the present invention.

If the analog value adjustment circuit according to the present embodiment is used, in a number of products, the cutting of the fuse elements in step S5 of FIG. 13 will be unnecessary. Therefore, time reduction of the cutting process (inspection process) of the fuse elements can be realized.

In addition, the present invention is not limited to the above described embodiments, and various kinds of modification can be implemented without departing from the spirit and scope of the present invention.

For example, in the specification or the drawings, terms (fuse elements FE1 through FE3, fuse data FS1 through FS3, taps TP1 through TP8, tap TP5, adjusted voltage/oscillation frequency or the like) quoted as terms in a broad sense or synonyms (first through Nth fuse elements, fuse data, first through Kth taps, Lth tap, analog value or the like) can be replaced with the terms in a broad sense or the synonyms also in the other description in the specification or the drawings.

Moreover, the structures of the fuse circuit, the analog value output circuit, and the display driver circuit are not limited to the structures described in detail in FIG. 3, FIG. 6, and FIG. 12, however, various modifications can be implemented. Moreover, the analog value that is the adjustment target of the present embodiment is not limited to a voltage value, a current value, a resistance, a capacitance value, and an oscillation frequency. Moreover, the fuse element may be a fusing non-volatile memory for fusing (electrically data-erasable and data-writable non-volatile memory, batch erasable non-volatile memory) which superficially substitutes the fuse element. In this case, the non-cutting state of the fuse element can correspond to, for example, the erase state of the non-volatile memory for fusing (memory cell), while the cutting state of the fuse elements can correspond to the writing state of the non-volatile memory for fusing (memory cell). Then, the fuse circuit (initialization circuit) outputs the fuse data (initialization data) corresponding to the erase state and the writing state (setup condition) of the non-volatile memory for fusing (memory cell). Moreover, in the case where the fuse data is the data indicting that all the first through Nth non-volatile memories for fusing (memory cells) are in the erase state, the analog value output circuit outputs the analog value with the typical value.

What is claimed is:

1. An analog value adjustment circuit comprising:
    a fuse circuit that outputs fuse data whose value changes corresponding to whether first through Nth (N is an integer of two or more) fuse elements are in a cutting state, or in a non-cutting state; and
    an analog value output circuit that receives the fuse data from the fuse circuit, and outputs an analog value that is adjusted in a given adjustment range corresponding to the fuse data, wherein the analog value output circuit comprises:
        a ladder resistor circuit comprising a plurality of resistor elements that are connected in series between a first node and a second node; and
        a select circuit that selects any one of a first through Kth taps of the ladder resistor circuit (K is an integer of two or more) based on the fuse data from the fuse circuit, and adjusts the analog value, and the select circuit selects a Lth tap (L is an integer and 1<L<K) corresponding to the typical value, when the fuse data from the fuse circuit is data indicating that all of the first through Nth fuse elements are in the non-cutting state,
    wherein when the fuse data from the fuse circuit is data indicating that all the first through Nth fuse elements are in the non-cutting state, the analog value output circuit outputs the analog value with a typical value that is a value between a maximum value and a minimum value in the given adjustment range,
    wherein in the ladder resistor circuit, the first through Kth taps are set so that the tape of a resistance of the resistor elements between taps becomes larger when being drawn closer to the first or Kth tap, and t he tap of the resistance of the resistor elements between taps becomes lower when being drawn closer to the Lth tap corresponding to the typical value.

2. The analog value adjustment circuit according to claim 1, wherein the select circuit selects a tap next to the Lth tap corresponding to the typical value, when the fuse data from the fuse circuit is data indicating that only one of the first through Nth fuse elements is in a cutting state.

3. The analog value adjustment circuit according to claim 1, wherein the select circuit comprises wiring capable of changing a wiring coupling pattern by a mask change and that couples a select input node of the select circuit to the first through Kth taps of the ladder resistor circuit.

4. An analog value adjustment circuit comprising:
a fuse circuit that outputs fuse data whose value changes corresponding to whether first through Nth (N is an integer of two or more) fuse elements are in a cutting state, or in a non-cutting state, wherein the fuse circuit comprises:
a latch circuit that stores a setup state for the first through Nth fuse elements; and
a latch clock generation circuit that generates a latch clock for taking in the setup state for the first through Nth fuse elements to the latch circuit based on a periodic signal, wherein the latch circuit periodically takes in the setup state for the first through Nth fuse elements based on the latch clock, and the fuse circuit outputs the fuse data based on the setup state for the first through Nth fuse elements taken in to the latch circuit; and
an analog value output circuit that receives the fuse data from the fuse circuit, and outputs an analog value that is adjusted in a given adjustment range corresponding to the fuse data,
wherein when the fuse data from the fuse circuit is data indicating that all the first through Nth fuse elements are in the non-cutting state, the analog value output circuit outputs the analog value with a typical value that is a value between a maximum value and a minimum value in the given adjustment range.

5. The analog value adjustment circuit according to claim 4, wherein the fuse circuit comprises:
a test signal storing circuit that stores a test signal of the first through Nth fuse elements;
a selector that selects and outputs, based on a select signal, either one of the test signal stored in the test signal storing circuit and the setup state for the first through Nth fuse elements that are taken in to the latch circuit; and
a select signal generation circuit that generates the select signal based on a test mode setup signal and the latch clock,
wherein the select signal generation circuit generates the select signal when the latch clock is inputted, so that the setup state for the first through Nth fuse elements, which are taken in to the latch circuit, is selected and outputted by the selector.

6. A method for adjusting an analog value comprising:
outputting fuse data whose value changes corresponding to whether first through Nth (N is an integer of two or more) fuse elements are in a cutting state, or in a non-cutting state;
receiving the fuse data and outputting an analog value that is adjusted in a given adjustment range corresponding to the fuse data;
outputting the analog value with a typical value that is a value between a maximum value and a minimum value in the given adjustment range when the fuse data is data indicating that all the first through Nth fuse elements are in the non-cutting state;
connecting a plurality of resistor elements in series between a first node and a second node of a ladder resistor circuit;
selecting any one of a first through Kth taps of the ladder resistor circuit (K is an integer of two or more) based on the fuse data, and adjusting the analog value; and
selecting a Lth tap (L is an integer and 1<L<K) corresponding to the typical value, when the fuse data is data indicating that all of the first through Nth fuse elements are in the non-cutting state,
setting the first through Kth taps so that the tap of a resistance of the resistor elements between taps becomes larger when being drawn closer to the first or Kth tap, and the tap of the resistance of the resistor elements between taps becomes lower when being drawn closer to the Lth tap corresponding to the typical value.

7. The method for adjusting an analog value according to claim 6, further comprising selecting a tap next to the Lth tap corresponding to the typical value, when the fuse data is data indicating that only one of the first through Nth fuse elements is in a cutting state.

8. The method for adjusting an analog value according to claim 6, further comprising changing a wiring coupling pattern by a mask change that couples a select input node of a select circuit to the first through Kth taps of the ladder resistor circuit.

9. An analog value adjustment circuit comprising:
a fuse circuit that outputs fuse data whose value changes corresponding to whether first through Nth (N is an integer of two or more) fuse elements are in a cutting state, or in a non-cutting state; and
an analog value output circuit that receives the fuse data from the fuse circuit, and outputs an analog value that is adjusted in a given adjustment range corresponding to the fuse data, wherein the analog value output circuit outputs the analog value that is adjusted so that an adjustment width becomes wider when being drawn closer to the maximum value or the minimum value in the given adjustment range, and the adjustment width becomes narrower when being drawn closer to the typical value, wherein the analog value output circuit comprises:
a ladder resistor circuit comprising a plurality of resistor elements that are connected in series between a first node and a second node; and
a select circuit that selects any one of a first through Kth taps of the ladder resistor circuit (K is an integer of two or more) based on the fuse data from the fuse circuit, and adjusts the analog value, and the select circuit selects a Lth tap (L is an integer and 1<L<K) corresponding to the typical value, when the fuse data from the fuse circuit is data indicating that all of the first through Nth fuse elements are in the non-cutting state, and
wherein when the fuse data from the fuse circuit is data indicating that all the first through Nth fuse elements are in the non-cutting state, the analog value output circuit outputs the analog value with a typical value that is a value between a maximum value and a minimum value in the given adjustment range.

* * * * *